United States Patent
Krug et al.

(10) Patent No.: US 11,561,247 B2
(45) Date of Patent: Jan. 24, 2023

(54) VOLTAGE MONITOR USING SWITCHING SIGNAL FOR MOTOR

(71) Applicant: Infineon Technologies AG, Neubiberg (DE)

(72) Inventors: Michael Krug, Munich (DE); Felix Weidner, Munich (DE); Christian Walther, Munich (DE)

(73) Assignee: Infineon Technologies AG, Neubiberg (DE)

( * ) Notice: Subject to any disclaimer, the term of this patent is extended or adjusted under 35 U.S.C. 154(b) by 101 days.

(21) Appl. No.: 17/234,165

(22) Filed: Apr. 19, 2021

(65) Prior Publication Data
US 2022/0334155 A1 Oct. 20, 2022

(51) Int. Cl.
*G01R 19/25* (2006.01)
*H02P 27/08* (2006.01)
*H03M 3/00* (2006.01)
*H03M 1/38* (2006.01)

(52) U.S. Cl.
CPC .......... *G01R 19/2513* (2013.01); *H02P 27/08* (2013.01); *H03M 1/38* (2013.01); *H03M 3/458* (2013.01)

(58) Field of Classification Search
CPC .......... H02P 27/00; H02P 27/04; H02P 27/06; H02P 27/08; H02P 27/085; H02P 29/00; H02P 21/00; H02P 21/14; H02P 21/20; H02P 21/22; H02P 21/34; H02P 23/00; H02P 23/14; H02P 23/28; H02P 25/00; H02P 25/022; H02P 25/03; H02P 25/062; H02P 25/064; H02P 25/086; H02P 6/00; H02P 6/10; H02P 6/15; H02P 6/26; H02P 1/00; H02P 1/16; H02P 1/18; H02P 1/24; H02P 1/26; H02P 1/46; H02P 3/00; H02P 3/24; H02P 6/12
See application file for complete search history.

(56) References Cited

FOREIGN PATENT DOCUMENTS

WO WO-2009075071 A2 * 6/2009 ............ H02P 29/026

OTHER PUBLICATIONS

Infineon Technologies, "16 Bit CMOS Microcontroller Product XC164CS," Application note, V 1.0, May 2004, 33 pp.
Texas Instruments, "UCC5870-Q1 Functional Safety Compliant 15-A Isolated IGBT/SiC MOSFET Gate Driver with Advanced Protection Features for Automotive Applications," UCC5870-Q1,SLUSD86B, Revised Nov. 2020, 112 pp.

* cited by examiner

*Primary Examiner* — Antony M Paul
(74) *Attorney, Agent, or Firm* — Shumaker & Sieffert, P.A.

(57) ABSTRACT

A device configured to monitor a voltage at a voltage rail for driving a motor includes processing circuitry configured to receive an indication of a switching signal for a phase of a plurality of phases of the motor. Inverter circuitry associated with the device is configured to electrically couple the phase to the voltage rail or to a reference rail associated with the voltage rail based on a driving signal that is generated based on the switching signal. The processing circuitry is further configured to determine a measurement time to measure the voltage at the voltage rail based on the switching signal and generate, using an analog-to-digital converter (ADC), a set of measured voltage values based on the voltage at the voltage rail during the measurement time.

20 Claims, 6 Drawing Sheets

VOLTAGE MONITOR USING SWITCHING SIGNAL FOR MOTOR

TECHNICAL FIELD

This disclosure relates to voltage monitoring, and more specifically, voltage monitoring associated with operating or controlling an electric motor.

BACKGROUND

Operation of a motor may be performed by a controller. The controller controls a rotor rotation of the motor based on a position of the rotor relative to stator coils of the motor. For example, the controller may control inverter circuitry to provide power from a voltage rail to each phase of the motor based on the rotor position to provide a desired rotor speed and/or torque.

SUMMARY

In general, this disclosure is directed to techniques for monitoring a voltage at a voltage rail for driving a motor. For example, inverter circuitry may electrically couple a phase of the motor to a voltage rail (e.g., a DC link) or a reference rail (e.g., ground associated with the voltage rail) to drive the motor. In this example, processing circuitry may be configured to determine a measurement time based on the switching signal. For instance, the processing circuitry may determine the measurement time to correspond to when the inverter circuitry couples the phase of the motor to the reference rail. The processing circuitry may be configured to generate, using an analog-to-digital converter (ADC), a set of measured voltage values based on the voltage at the voltage rail during the measurement time. In this way, the processing circuitry may generate the set of measured voltage values when the phase is electrically coupled to the reference rail, which may reduce an amount of voltage ripple occurring at the voltage rail. Reducing the amount of voltage ripple may improve an accuracy of the set of measured voltage values compared to systems that generate the set of measured voltage values without determining the measurement time based on a switching signal (e.g., systems that generate the set of measured voltages regardless of whether the phase is electrically coupled to the voltage rail or the reference rail).

In one example, a device configured to monitor a voltage at a voltage rail for driving a motor includes processing circuitry configured to receive an indication of a switching signal for a phase of a plurality of phases of the motor. Inverter circuitry associated with the device is configured to electrically couple the phase to the voltage rail or to a reference rail associated with the voltage rail based on a driving signal that is generated based on the switching signal. The processing circuitry is further configured to determine a measurement time to measure the voltage at the voltage rail based on the switching signal and generate, using an ADC, a set of measured voltage values based on the voltage at the voltage rail during the measurement time.

In another example, this disclosure describes a method of monitoring a voltage at a voltage rail for driving a motor, the method comprising receiving, with processing circuitry, an indication of a switching signal for a phase of a plurality of phases of the motor. Inverter circuitry associated with the processing circuitry is configured to electrically couple the phase to the voltage rail or to a reference rail associated with the voltage rail based on a driving signal that is generated based on the switching signal. The method further includes determining, with the processing circuitry, a measurement time to measure the voltage at the voltage rail based on the switching signal and generating, with the processing circuitry and using an ADC, a set of measured voltage values based on the voltage at the voltage rail during the measurement time.

In another example, this disclosure describes a host controller configured to generate a switching signal, inverter circuitry, an ADC, and processing circuitry. The processing circuitry is configured to receive an indication of the switching signal for a phase of a plurality of phases of a motor. The inverter circuitry is configured to electrically couple the phase to a voltage rail or to a reference rail associated with the voltage rail based on a driving signal that is generated based on the switching signal. The processing circuitry is configured to determine a measurement time to measure the voltage at the voltage rail based on the switching signal and generate, using the ADC, a set of measured voltage values based on the voltage at the voltage rail during the measurement time.

Details of these and other examples are set forth in the accompanying drawings and the description below. Other features, objects, and advantages will be apparent from the description and drawings, and from the claims.

DETAILED DESCRIPTION

Figure 1:
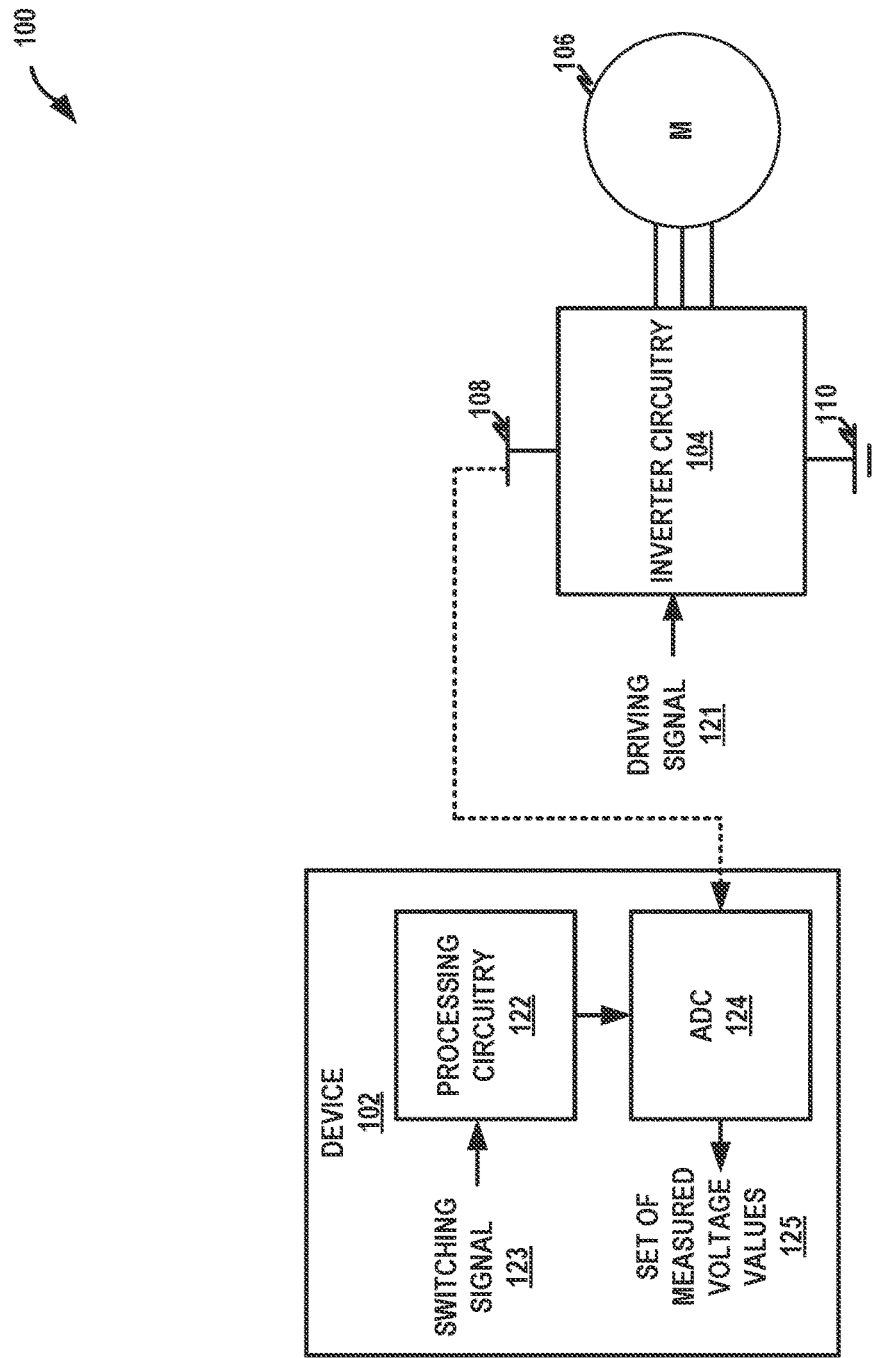
FIG. 1 is a block diagram illustrating an example system configured to monitor a voltage at a voltage rail for driving a motor, in accordance with one or more techniques of this disclosure.

This disclosure is directed to techniques for monitoring a voltage at a voltage rail for driving a motor. The techniques described herein may be applied to systems comprising a motor, such as, for example, a brushless direct current (BLDC) motor. While examples described herein refer to an automotive application, techniques described herein may be used in other applications.

For example, inverter circuitry of a system in an automobile (e.g., an electric vehicle) may be directly connected to a voltage rail, such as a high voltage (HV) DC link. The voltage rail may be located in an HV domain. The system may be configured to generate a set of measured voltage values for the voltage rail in a low voltage domain (LV) that is galvanically isolated from the HV domain. The system may generate the set of measured voltage values with sampling rates greater than 10 kHz (e.g., greater than 100 kHz).

The system may use the set of measured voltage values to calculate power losses inside switching elements (e.g., power semiconductors) of the inverter circuitry. In some examples, the system may use the set of measured voltage values for torque control algorithms to drive the motor. The system may use the set of measured voltage values to monitor voltage of the voltage rail for safety. For instance, the system may use the set of measured voltage values to verify that the voltage at the voltage rail (e.g., at a DC link capacitor for the voltage rail) is less than a voltage threshold (e.g., 60 volts) using the set of measured voltage values, which may help to improve safety for humans.

In order to help to improve an accuracy of the set of measured voltage values, some systems may use an external high precision isolated analog-to-digital converter (ADC) with a high update rate (e.g., sampling greater than 10 kHz) to generate the set of measured voltage values for the voltage rail. As a voltage ripple on the voltage at the voltage rail may be dominated by a rotation of a rotor of the motor, processing circuitry in such systems may be configured to recalculate the set of measured voltage values from the ADC and synchronize the set of measured voltage values to a switching pattern of inverter circuitry used to generate a motor rotation field. The synchronization of the set of measured voltage values to the switching pattern may increase an accuracy of the set of measured voltage values by using only the samples at a certain deterministic point in the switching pattern.

However, in systems configured to rely only on a recalculation of the set of measured voltage values from the ADC, the ADC may not be synchronized to the switching pattern of inverter circuitry. Therefore, the processing circuitry may resynchronize the set of measured voltage values generated by the ADC and the switching pattern of the inverter circuitry to increase the accuracy of the set of measured voltages. For example, the processing circuitry may ignore or remove measured voltage values from the set of measured voltage values that correspond to when the voltage rail drives the motor (e.g., provides an electrical current to the motor). After resynchronizing the set of measured voltage values generated by the ADC and the switching pattern of the inverter circuitry, the processing circuitry may filter the set of measured voltage values with the actual rotation speed of the motor. As such, systems configured to recalculate the set of measured voltage values from the ADC may rely on external additional components (e.g., a filter, a data store, and/or logic circuitry) adding costs and space constraints compared to systems that do not recalculate the set of measured voltage values from the ADC.

In accordance with the techniques of the disclosure, processing circuitry may determine a measurement time to measure a voltage at the voltage rail based on a switching signal for a phase of a motor. In this example, the processing circuitry may generate, using an ADC, a set of measured voltage values based on the voltage at the voltage rail during the measurement time. In this way, the processing circuitry may "synchronize" the ADC conversion timing of the ADC, which may reduce an amount of data transmitted from the ADC to a host device compared to systems that synchronize after the ADC samples and outputs measured voltage values. For instance, the processing circuitry may synchronize the ADC conversion timing of an internal isolated ADC in a low-side gate drive integrated circuit (IC) to the switching signal, such as pulse-width modulated (PWM) signals of a high-side driver using incoming signals (e.g., INN signals) to generate a set of measured voltage values for the voltage rail (e.g., a DC link) that is decoupled from noise generated by a rotation of a rotor of the motor. The processing circuitry may determine a measurement time to measure a voltage at the voltage rail using one or more INN signals at a low-side gate driver that may represent the INP signal of the high-side driver and/or the PWM ON-time of the high-side driver.

FIG. 1 is a block diagram illustrating an example system 100 configured to monitor a voltage at a voltage rail 108 for driving a motor 106, in accordance with one or more techniques of this disclosure. As illustrated in the example of FIG. 1, system 100 may include device 102, inverter circuitry 104, motor 106, voltage rail 108, and reference rail 110.

Voltage rail 108 may represent supply for motor 106, such as, for example, an inverter DC link. Similarly, reference rail 110 may represent a reference rail associated with voltage rail 108. For example, an energy storage element (e.g., a capacitor or battery) may comprise a first terminal (e.g., a positive terminal or a negative terminal) electrically coupled to voltage rail 108 and a second terminal (e.g., a negative terminal or a positive terminal) electrically coupled to reference rail 110.

Motor 106 may include, for example, a permanent magnet synchronous motor (PMSM), an externally excited motor, or an asynchronous motor. Motor 106 may operate as only a load to produce mechanical energy, only a generator to produce electrical energy, or both a motor and a generator. For example, a PMSM may include a shaft, rotor, stator, and permanent magnet. A permanent magnet may be mounted on or in the rotor. In some examples, the permanent magnet may be surface mounted to the rotor, inset in the rotor, or buried within the rotor. In some examples, the permanent magnet may be an interior magnet. The permanent magnet may include rare-earth elements, such as Neodymium-Iron-Boron (NdFeB), Samarium-Cobalt (SmCo), or Ferrite elements (e.g., Barium (Ba) or Strontium (Sr)). In some examples, the permanent magnet may include a protective coating such as a layer of Gold (Au), Nickel (Ni), Zinc (Zn), or the like. In some examples, motor 106 may be multiphase. For example, motor 106 may be a three-phase BLDC motor. However, in other examples, motor 106 may include one, two, or more than three phases.

Inverter circuitry 104 may be configured to electrically couple a phase of motor 106 to voltage rail 108 or to reference rail 110 based on a driving signal 121. Inverter circuitry 104 may include, for example, an 'n' phase inverter, where 'n' may be the same number of phases of motor 106. Inverter circuitry 104 may include one or more switching elements (e.g., MOS power switch transistors based switching elements, gallium nitride (GaN) based switching elements, or other types of switching elements) that are controlled using driving signal 121. In PWM, the width (e.g., duration) of the pulse is modulated based on a modulator signal, such as, for example, driving signal 121.

Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. MOSFETS may be formed in silicon, gallium nitride (GaN), silicon carbide (SiC) or other semiconductor materials.

Examples of BJTs may include, but are not limited to, PNP, NPN, heterojunction, or any other type of BJT, or any combination of the same. It should be understood that switching elements may be high-side or low-side switching elements. Additionally, switching elements may be voltage-controlled and/or current-controlled. Examples of current-controlled switching elements may include, but are not limited to, GaN MOSFETs, BJTs, or other current-controlled elements. In some examples, a switching element may comprise a bi-directionally blocking device with a diode. For example, a switching element may include an IGBT with a diode in anti-parallel with the IGBT.

Device 102 may be configured to monitor a voltage at voltage rail 108 for driving motor 106. Device 102 may include processing circuitry 122 and ADC 124. ADC 124 may include one or more of a successive-approximation ADC or a delta-sigma ADC. In some examples, device 102 may comprise a gate driver (e.g., a low-side gate driver or a high-side gate driver) configured to generate driving signal 121 based on switching signal 123. However, in some examples, device 102 may omit a gate driver.

Processing circuitry 122 may include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

In accordance with one or more techniques described herein, processing circuitry 122 may receive an indication of a switching signal 123 for a phase of motor 106. Inverter circuitry 104 may be configured to electrically couple the phase to voltage rail 108 or to reference rail 110 based on driving signal 121 that is generated based on switching signal 123. Processing circuitry 122 may determine a measurement time to measure the voltage at voltage rail 108 based on switching signal 123. Processing circuitry 122 may generate, using ADC 124, a set of measured voltage values 125 based on the voltage at voltage rail 108 during the measurement time.

In this way, processing circuitry 122 may generate set of measured voltage values 125 at voltage rail 108 when the phase of motor 106 is electrically coupled to reference rail 110 and refrain from generating set of measured voltage values 125 at voltage rail 108 when the phase of motor 106 is electrically coupled to voltage rail 108, which can reduce an amount of voltage ripple occurring at voltage rail 108. Reducing the amount of voltage ripple occurring at voltage rail 108 may improve an accuracy of set of measured voltage values 125 at voltage rail 108 compared to systems that generate set of measured voltage values 125 without determining the measurement time based on switching signal 123 (e.g., systems that generate the set of measured voltages when the phase is electrically coupled to the voltage rail). Improving the accuracy of set of measured voltage values 125 may reduce an expense of external components of inverter circuitry 104 (e.g., switching elements) compared to systems that generate set of measured voltage values 125 without determining the measurement time based on switching signal 123. In some examples, determining the measurement time based on switching signal 123 may reduce an expense of external measurement components (e.g., ADC 124) compared to systems that generate set of measured voltage values 125 without determining the measurement time based on switching signal 123.

System 100 (e.g., a host controller or a microcontroller) may omit a process of syncing, after ADC 124 generates set of measured voltage values 125, set of measured voltage values 125 to a switching pattern for switching signal 123 and/or driving signal 121. However, in some examples, system 100 (e.g., processing circuitry 122) may sync set of measured voltage values 125 to a switching pattern for switching signal 123 and/or driving signal 121 after ADC 124 generates set of measured voltage values 125. In this way, an accuracy of measuring a voltage at voltage rail 108 may be increased.

While system 100 illustrates one device 102, some examples may include any number 'm' of devices (e.g., a plurality of gate driver ICs). In this example, a host controller (e.g., a microcontroller) may use the 'm' number of devices to perform a plausibility check with either 1 or up to 'n' resistor ladders. For example, the host controller may determine a verified set of measured voltage values based on a first set of measured voltage values generated by a first ADC of a first low-side gate driver, a second set of measured voltage values generated by a second ADC of a second low-side gate driver, and a third set of measured voltage values generated by a third ADC of a third low-side gate driver. For instance, the host controller may determine the verified set of measured voltage values as an average of the first set of measured voltage values, the second set of measured voltage values and the third set of measured voltage values when a difference between the first set of measured voltage values, the second set of measured voltage values and the third set of measured voltage values is less than a threshold range. In this way, system 100 may provide a redundancy in measuring the voltage at voltage rail 108, which may improve a safety of system 100 compared to systems relying on only one device to generate set of measured voltage values 125 at voltage rail 108.

Figure 2:
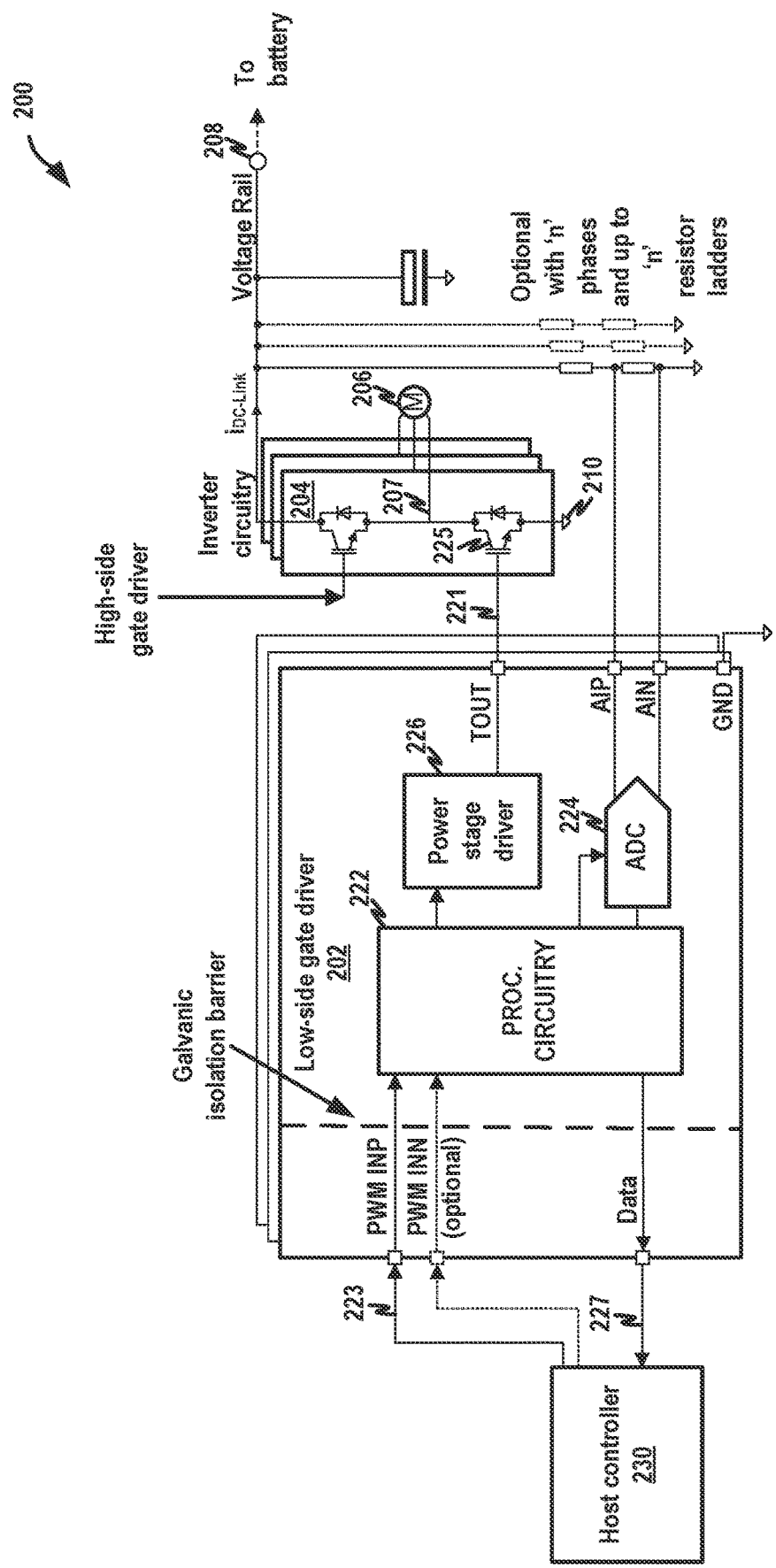
FIG. 2 is a conceptual diagram illustrating an example of a low-side gate driver configured to monitor a voltage at a voltage rail for driving a motor, in accordance with one or more techniques of this disclosure.

FIG. 2 is a conceptual diagram illustrating an example of a low-side gate driver 202 configured to monitor a voltage at a voltage rail 208 for driving a motor 206, in accordance with one or more techniques of this disclosure. As illustrated in the example of FIG. 2, system 200 may include low-side gate driver 202, inverter circuitry 204, motor 206, voltage rail 208, and reference rail 210, which may be examples of device 102, inverter circuitry 104, motor 106, voltage rail 108, and reference rail 110, respectively, of FIG. 1.

Low-side gate driver 202 may be configured to generate a driving signal 221 to drive a switching element 225 of inverter circuitry 204 to refrain from electrically coupling a phase 207 to reference rail 210 when switching signal 223 indicates to electrically couple phase 207 to voltage rail 207 and to electrically couple phase 207 to reference rail 210 when switching signal 223 indicates to electrically couple phase 207 to reference rail 210. In this example, switching signal 223 is received at a PWM INP pin, however, in some examples, switching signal 223 may be received at a different pin. For example, switching signal 223 may be additionally or alternatively received at a PWM INN pin or another pin of low-side gate driver 202.

For example, processing circuitry 222 may control a power stage driver 226 to generate driving signal 221 based on switching signal 223. For instance, power stage driver 226 may generate driving signal 221 to correspond to a switching pattern of switching signal 223 with a higher voltage amplitude, which may reduce switching losses in inverter circuitry 204 compared to systems that omit power stage driver 226. Switching element 225 of inverter circuitry 204 may be configured to electrically couple phase 207 to voltage rail 208 or to reference rail 210 based on driving signal 221.

Processing circuitry 222 may determine a measurement time to measure the voltage at voltage rail 108 based on switching signal 223 and generate, using ADC 224, a set of measured voltage values 227 based on the voltage at voltage rail 208 during the measurement time. For example, when switching low-side gate driver 202 to an ON state (e.g., a switched-in state), processing circuitry 222 may cause ADC 224 to start a measurement conversion process. When switching low-side gate driver 202 to an OFF state (e.g., a switched-out state), processing circuitry 222 may cause ADC 224 stop the measurement conversion process. In this way, a center of the measured voltage samples for the set of voltage values 227 is in a middle of a high-side PWM ON-time, which is represented by the "INN signal" at the low-side.

Processing circuitry 222 may output voltage rail voltage information to host controller 230. In some examples, the voltage rail voltage information is transferred galvanically isolated to a primary side (e.g., host controller 230) and is provided to host controller 230 e.g. via external bitstream (PWM) or stored in registers of the device for readout e.g. via serial peripheral interface (SPI).

While system 200 illustrates one low-side gate driver 202, some examples may include a plurality of gate drivers, e.g., 'm' number of low-side gate drivers where 'm' is a positive integer greater than 1. In this example, host controller 230 may use the 'm' number of devices to perform a plausibility check with either 1 or up to 'n' resistor ladders. For example, as the 'm' number of low-side gate drivers are able to measure voltage at voltage rail 208 independent from each other and synchronized to a respective switching signal (e.g., an INN signal), host controller 230 may be configured to decide a result to use, e.g. the one with the longest conversation. In some examples, host controller 230 may use the 'm' number of sets of measured voltage values signals as plausibility check of the results against each other. In this way, host controller 230 may use a center of each high-side PWM on-time, which is the same for all 'm' number of low-side gate drivers. Host controller 230 may use the determined plausibility as safety mechanism to achieve diagnostic coverages or failures in time (FIT) rates on a system level for safety related to a voltage at voltage rail 208.

For example, processing circuitry 222, which may include logic circuitry at low-side gate driver 202 and logic circuitry at a second gate driver (e.g., a low-side gate driver), may be configured to determine a second measurement time to measure the voltage at voltage rail 208 based on a second switching signal. In this example, inverter circuitry 204 may be configured to electrically couple a second phase of motor 206 to voltage rail 208 or to reference rail 210 based on a second driving signal generated using the second switching signal. Processing circuitry 222 may generate (e.g., using a second ADC of the second gate driver) a second set of measured voltage values based on the voltage at voltage rail 208 during the second measurement time.

Processing circuitry 222 may generate an average voltage value for voltage rail 208 based on the first set of measured voltage values and the second set of measured voltage values. For example, processing circuitry 222 may generate a first averaged voltage value for voltage rail 208 based on the first set of measured voltage values and generate a second averaged voltage value based on the second set of measured voltage values. Processing circuitry 222 may output the voltage rail voltage information to host controller 230. The voltage rail voltage information may include one or more of the set of measured voltage values or an averaged voltage value generated based on the set of measured voltage values. For example, processing circuitry 222 may output the voltage rail voltage information to host controller 230 such that the voltage rail voltage information includes a first set of measured voltage values from low-side gate driver 202 and a second set of measured voltage values from a second gate driver. In some examples, processing circuitry 222 may output the voltage rail voltage information to host controller 230 such that the voltage rail voltage information includes an average voltage value generated based on the first set of measured voltage values from low-side gate driver 202 and the second set of measured voltage values from a second gate driver.

Host controller 230 may be configured to generate switching signal 223 based on the voltage rail voltage information. For example, host controller 230 may be configured to apply a torque control technique using the voltage rail voltage information to generate switching signal 223. Host controller 230 may be configured to determine whether an unsafe voltage is occurring at voltage rail 208 based on the voltage rail voltage information. For example, host controller 230 may be configured to determine that the unsafe voltage is occurring at voltage rail 208 in response to determining that the voltage exceeds a voltage threshold (e.g., 60 volts).

Figure 3:
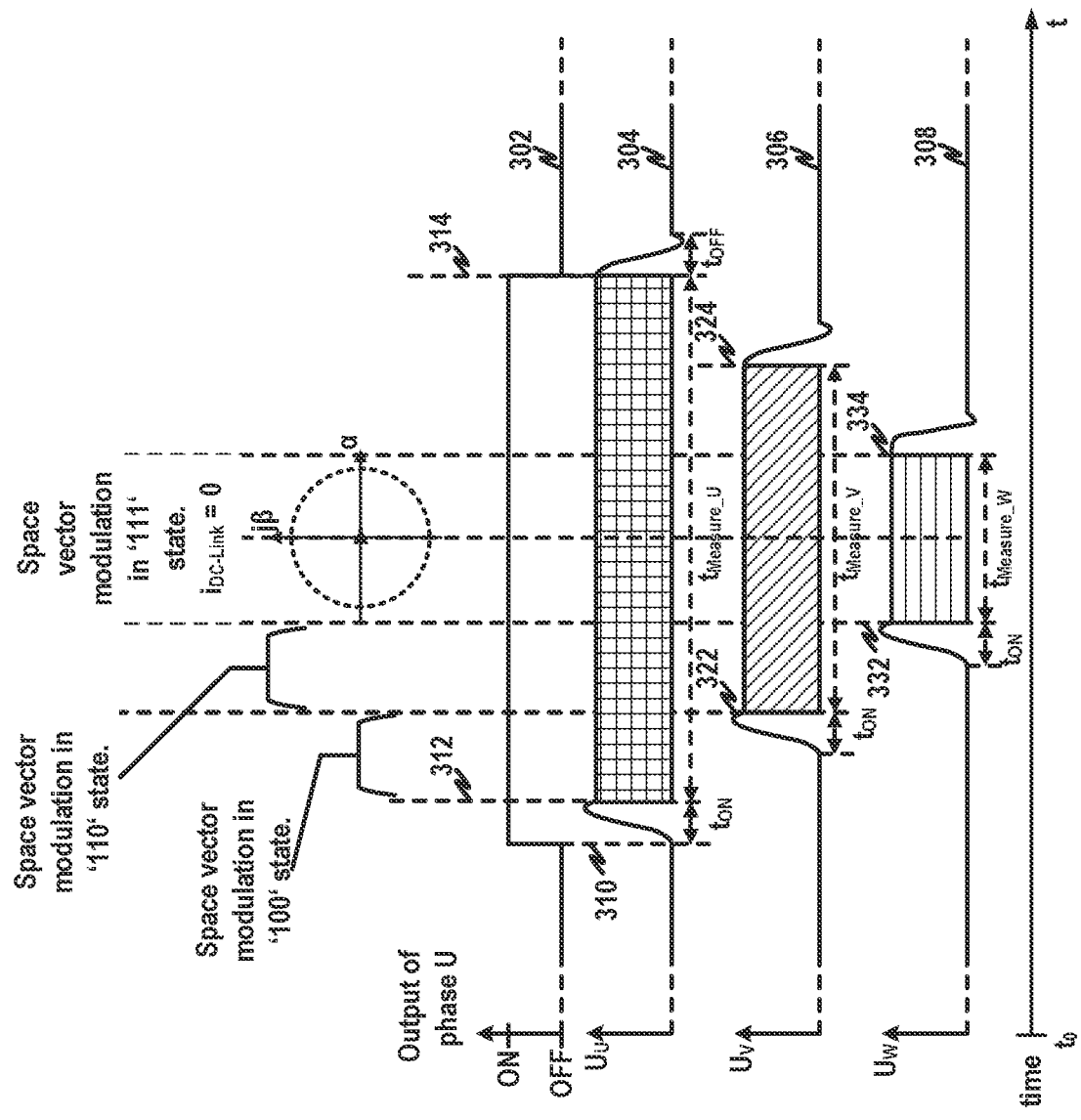
FIG. 3 is a conceptual diagram illustrating a first example measurement time, in accordance with one or more techniques of this disclosure.

FIG. 3 is a conceptual diagram illustrating a first example measurement time, in accordance with one or more techniques of this disclosure. The abscissa axis of FIG. 3 represents time (t) and the ordinate axis of FIG. 3 represents a state (e.g., ON or OFF) of switching signal 302, a first driving signal 304 ($U_U$) at a first phase of motor 106, a second driving signal 306 ($U_V$) at a second phase of motor 106, and a third driving signal 308 ($U_W$) at a third phase of motor 106. The example of FIG. 3 is discussed with reference to FIGS. 1-2 for example purposes only. In this example, inverter circuitry 104 switches ON first driving signal 304 during space vector modulation state '100' to electrically couple the first phase to reference rail 110, switches ON second driving signal 306 during space vector modulation state '110' to electrically couple the second phase to reference rail 110, and switches ON third driving signal 306 during space vector modulation state '111' to electrically couple the third phase to reference rail 110.

In the example of FIG. 3, processing circuitry 122 may be configured to determine a first time value 310 of a cycle of switching signal 302 corresponding to when switching signal 302 changes from an indication to electrically couple the phase to voltage rail 108 to an indication to electrically couple the phase to reference rail 110. Processing circuitry 122 may be configured to generate a measurement time ($t_{measure\_U}$) to start after first time value 310 plus a turn-on delay ($t_{ON}$). For example, processing circuitry 122 may be configured to generate the measurement time ($t_{measure\_U}$) to start after first start time value 312.

Processing circuitry 122 may be configured to determine a second time value 314 of the cycle of switching signal 302 corresponding to when switching signal 302 changes from the indication to electrically couple the phase to reference rail 110 to the indication to electrically couple the phase to voltage rail 108. Processing circuitry 122 may be configured to generate the measurement time to end when switching signal 302 changes from the indication to electrically couple the phase to reference rail 110 to the indication to electrically couple the phase to voltage rail 108.

In some examples, processing circuitry 122 may determine a respective measurement time for each phase of motor 106. For example, processing circuitry 122 may be configured to generate a measurement time ($t_{measure\_V}$) for a second phase of motor 106 to start after time value 322 and end at time value 324. Processing circuitry 122 may be configured to generate a measurement time ($t_{measure\_W}$) for a third phase of motor 106 to start after time value 332 and end at time value 334. Processing circuitry 122 may be configured to generate a set of measured voltage values during the measurement times for each phase. In some examples, processing circuitry 122 may be configured to average the set of measured voltage values.

Figure 4:
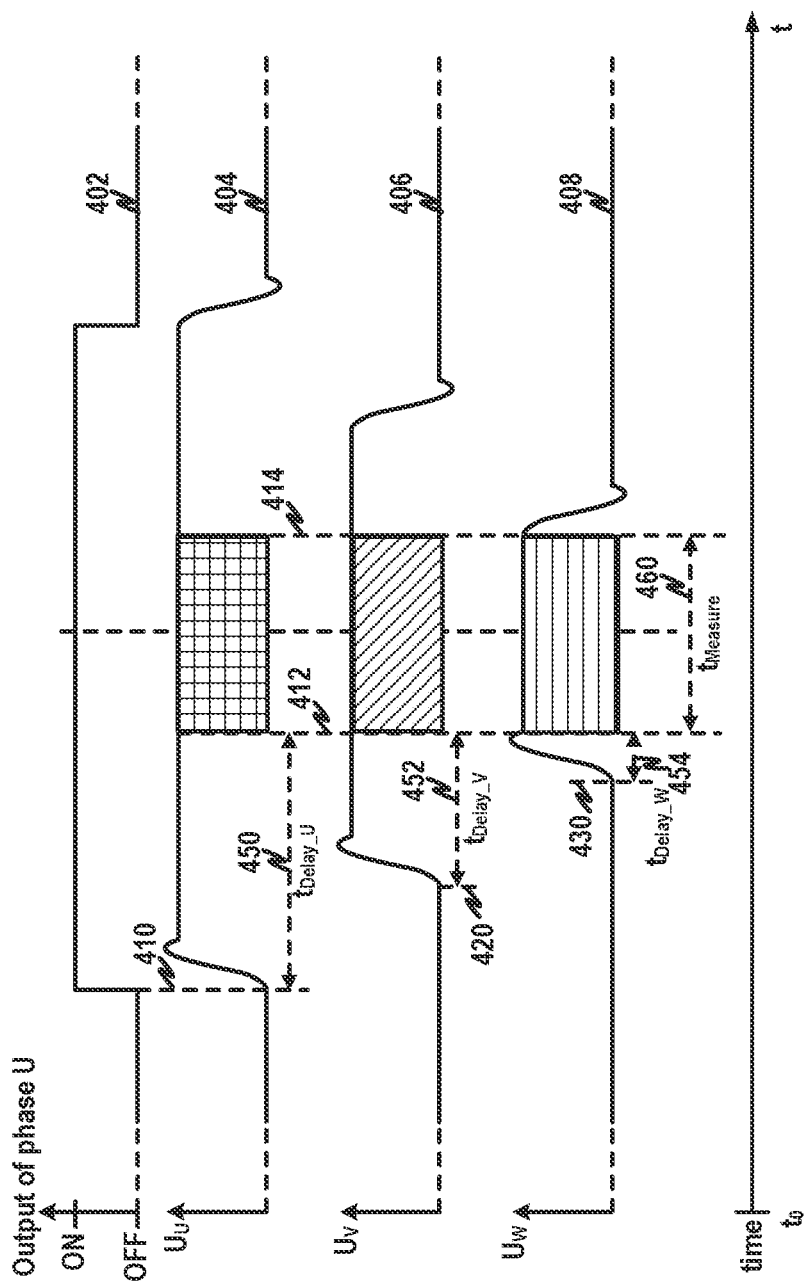
FIG. 4 is a conceptual diagram illustrating a second example measurement time, in accordance with one or more techniques of this disclosure.

FIG. 4 is a conceptual diagram illustrating a second example measurement time, in accordance with one or more techniques of this disclosure. The abscissa axis of FIG. 4 represents time (t) and the ordinate axis of FIG. 4 represents a state (e.g., ON or OFF) of switching signal 402, a first driving signal 404 ($U_U$) at a first phase of motor 106, a second driving signal 406 ($U_V$) at a second phase of motor 106, and a third driving signal 408 ($U_W$) at a third phase of motor 106. The example of FIG. 4 is discussed with reference to FIGS. 1-2 for example purposes only.

In the example of FIG. 4, processing circuitry 122 may be configured to generate a measurement time for the first phase to start after a first time value 410 plus a programmable delay 450. In some examples, programmable delay 450 may be defined to start the measurement time for the first phase when all of the phases of motor 106 are coupled to reference rail 110. For instance, processing circuitry 122 may be configured to generate the measurement time for the first phase to start at time value 412. In some examples, processing circuitry 122 may be configured to generate the measurement time for the first phase to end after a second programmable delay 460, which may correspond to a measurement time ($t_{Measure}$). For instance, processing circuitry 122 may be configured to generate the measurement time for the first phase to end at time value 414. In some examples, second programmable delay 460 may be defined to end the measurement time when one or more of the phases of motor 106 are coupled to voltage rail 108.

Processing circuitry 122 may determine a respective measurement time for each phase of motor 106. For example, processing circuitry 122 may be configured to generate a measurement time for the second phase to start after a second time value 420 plus a programmable delay 452. In some examples, programmable delay 452 may be defined to start the measurement time for the second phase when all of the phases of motor 106 are coupled to reference rail 110. For instance, processing circuitry 122 may be configured to generate the measurement time for the second phase to start at time value 412. In some examples, processing circuitry 122 may be configured to generate the measurement time for the second phase to end after a second programmable delay 460, which may correspond to a measurement time ($t_{Measure}$). For instance, processing circuitry 122 may be configured to generate the measurement time for the second phase to end at time value 414.

Similarly, processing circuitry 122 may be configured to generate a measurement time for the third phase to start after a third time value 430 plus a programmable delay 454. In some examples, programmable delay 454 may be defined to start the measurement time for the third phase when all of the phases of motor 106 are coupled to reference rail 110. For instance, processing circuitry 122 may be configured to generate the measurement time for the third phase to start at time value 412. In some examples, processing circuitry 122 may be configured to generate the measurement time for the third phase to end after a second programmable delay 460, which may correspond to a measurement time ($t_{Measure}$). For instance, processing circuitry 122 may be configured to generate the measurement time for the third phase to end at time value 414.

Figure 5:
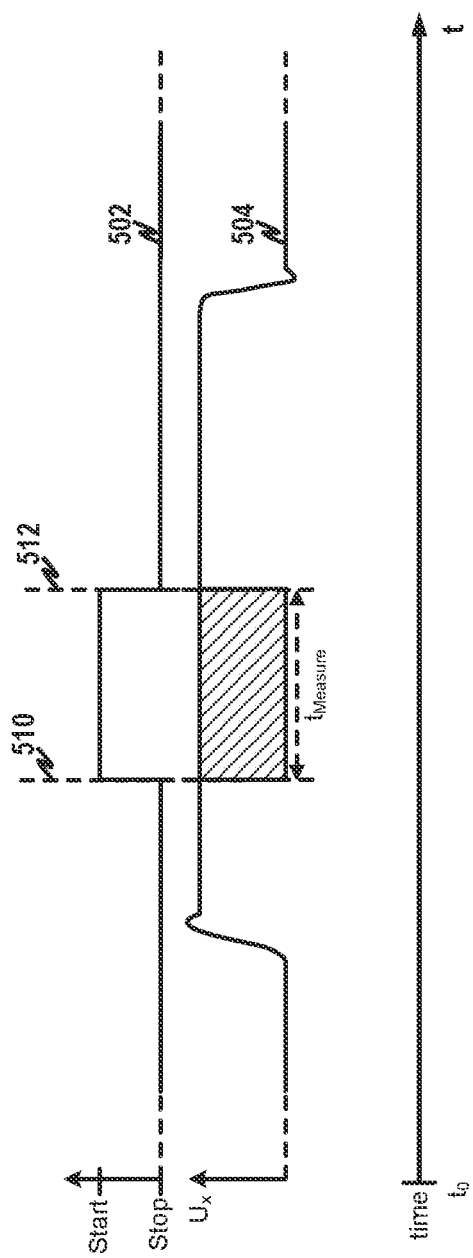
FIG. 5 is a conceptual diagram illustrating a third example measurement time, in accordance with one or more techniques of this disclosure.

FIG. 5 is a conceptual diagram illustrating a third example measurement time, in accordance with one or more techniques of this disclosure. The abscissa axis of FIG. 5 represents time (t) and the ordinate axis of FIG. 5 represents a state (e.g., measure or do not measure) of switching signal 502 and a driving signal 402 at a phase of motor 106. The example of FIG. 5 is discussed with reference to FIGS. 1-2 for example purposes only.

In the example of FIG. 5, host controller 230 may be configured to generate a measurement time ($t_{Measure}$) for each phase to start at a first time value 510 and to end at time value 512. Host controller 230 may be configured to output a measurement signal indicating the measurement time to low-side gate driver 202 using a dedicated measurement start pin. In some examples, host controller 230 may generate measurement signal based on the switching signal. For example, host controller 230 may generate the measurement signal using one or more techniques described with reference to FIG. 4.

Figure 6:
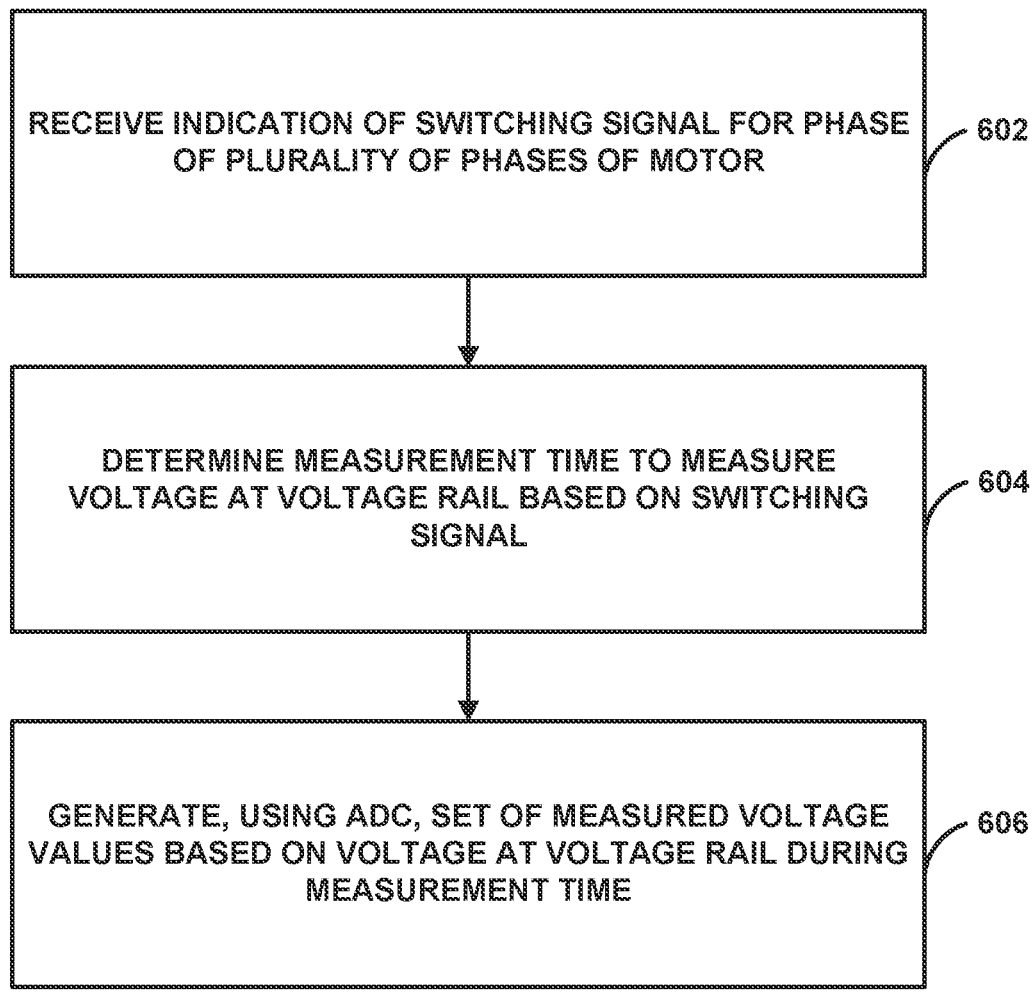
FIG. 6 is a flow diagram consistent with techniques that may be performed by the example system of FIG. 1, in accordance with this disclosure.

FIG. 6 is a flow diagram consistent with techniques that may be performed by the example system of FIG. 1, in accordance with this disclosure. FIG. 6 is discussed with reference to FIGS. 1-5 for example purposes only.

In accordance with the techniques of the disclosure, processing circuitry 122 may receive an indication of switching signal 123 for a phase of a plurality of phases of motor 106 (602). Inverter circuitry 104 may be configured to electrically couple the phase to voltage rail 108 or to reference rail 110 based on driving signal 121. Driving signal 121 may be generated based on switching signal 123. For example, processing circuitry 222 of FIG. 2 may use power stage driver 226 to generate driving signal 221 based on switching signal 223.

Processing circuitry 122 may determine a measurement time to measure the voltage at voltage rail 108 based on switching signal 123 (604). For example, processing circuitry 122 may determine the measurement time ($t_{measure\_U}$) to start after first time value 310 plus a turn-on delay ($t_{ON}$) as shown in the example of FIG. 3. In some examples, processing circuitry 122 may determine the measurement time ($t_{measure\_U}$) to start after a first time value 410 plus a programmable delay 450 as shown in the example of FIG. 4.

Processing circuitry 122 may generate, using ADC 124, set of measured voltage values 125 based on the voltage at voltage rail 108 during the measurement time (606). For example, processing circuitry 122 may cause ADC 124 to measure a voltage at voltage rail 108 during the measurement time.

The following examples may illustrate one or more aspects of the disclosure.

Example 1: A device configured to monitor a voltage at a voltage rail for driving a motor, the device comprising processing circuitry configured to: receive an indication of a switching signal for a phase of a plurality of phases of the motor, wherein inverter circuitry associated with the device is configured to electrically couple the phase to the voltage rail or to a reference rail associated with the voltage rail based on a driving signal that is generated based on the switching signal; determine a measurement time to measure the voltage at the voltage rail based on the switching signal; and generate, using an analog-to-digital converter (ADC), a set of measured voltage values based on the voltage at the voltage rail during the measurement time.

Example 2: The device of example 1, wherein the device comprises a gate driver configured to generate the driving signal to drive a switching element to refrain from electrically coupling the phase to the reference rail when the switching signal indicates to electrically couple the phase to the voltage rail and to electrically couple the phase to the reference rail when the switching signal indicates to electrically couple the phase to the reference rail.

Example 3: The device of any of examples 1 and 2, wherein, to generate the measurement time, the processing circuitry is configured to determine a first time value of a cycle of the switching signal corresponding to when the switching signal changes from an indication to electrically couple the phase to the voltage rail to an indication to electrically couple the phase to the reference rail.

Example 4: The device of example 3, wherein, to generate the measurement time, the processing circuitry is configured to generate the measurement time to start after the first time value plus a turn-on delay.

Example 5: The device of example 4, wherein, to generate the measurement time, the processing circuitry is configured to: determine a second time value of the cycle of the switching signal corresponding to when the switching signal changes from the indication to electrically couple the phase to the reference rail to the indication to electrically couple the phase to the voltage rail; and generate the measurement time to end when the switching signal changes from the indication to electrically couple the phase to the reference rail to the indication to electrically couple the phase to the voltage rail.

Example 6: The device of example 3-5, wherein, to generate the measurement time, the processing circuitry is configured to generate the measurement time to start after the first time value plus a programmable delay.

Example 7: The device of example 6, wherein the programmable delay is defined to start the measurement time when all of the phases of the motor are coupled to the reference node.

Example 8: The device of example 6, wherein the programable delay is a first programable delay and wherein, to generate the measurement time, the processing circuitry is configured to generate the measurement time to end after a second programmable delay.

Example 9: The device of example 8, wherein the second programmable delay is defined to end the measurement time when one or more of the phases of the motor are coupled to the voltage rail.

Example 10: The device of any of examples 1 through 9, wherein the switching signal is a first switching signal, the phase is a first phase, the measurement time is a first measurement time and the set of measured voltage values is a first set of measured voltage values, and wherein the processing circuitry is further configured to: determine a second measurement time to measure the voltage at the voltage rail based on a second switching signal, wherein the inverter circuitry is further configured to electrically couple a second phase of the plurality of phases of the motor to the voltage rail or to the reference rail based on a second driving signal generated using the second switching signal; and generate a second set of measured voltage values based on the voltage at the voltage rail during the second measurement time.

Example 11: The device of example 10, wherein the processing circuitry is configured to generate an averaged voltage value for the voltage rail based on the first set of measured voltage values and the second set of measured voltage values.

Example 12: The device of example 10, wherein the processing circuitry is configured to: generate a first averaged voltage value for the voltage rail based on the first set of measured voltage values; and generate a second averaged voltage value based on the second set of measured voltage values.

Example 13: The device of any one of examples 1-12, wherein the processing circuitry is further configured to output voltage rail voltage information to a host controller, wherein the voltage rail voltage information comprises one or more of the set of measured voltage values or an averaged voltage value generated based on the set of measured voltage values.

Example 14: The device of example 13, wherein the host controller is configured to generate the switching signal based on the voltage rail voltage information.

Example 15: The device of any of examples 13-14, wherein the host controller is further configured to determine whether an unsafe voltage is occurring at the voltage rail based on the voltage rail voltage information.

Example 16: The device of any of examples 1-15, wherein the ADC comprises one or more of a successive-approximation ADC or a delta-sigma ADC.

Example 17: A method of monitoring a voltage at a voltage rail for driving a motor, the method comprising: receiving, with processing circuitry, an indication of a switching signal for a phase of a plurality of phases of the motor, wherein inverter circuitry associated with the processing circuitry is configured to electrically couple the phase to the voltage rail or to a reference rail associated with the voltage rail based on a driving signal that is generated based on the switching signal; determining, with the processing circuitry, a measurement time to measure the voltage at the voltage rail based on the switching signal; and generating, with the processing circuitry and using an analog-to-digital converter (ADC), a set of measured voltage values based on the voltage at the voltage rail during the measurement time.

Example 18: A system comprising: a host controller configured to generate a switching signal; inverter circuitry; an analog-to-digital converter (ADC); and processing circuitry configured to: receive an indication of the switching signal for a phase of a plurality of phases of a motor, wherein the inverter circuitry is configured to electrically couple the phase to a voltage rail or to a reference rail associated with the voltage rail based on a driving signal that is generated based on the switching signal; determine a measurement time to measure the voltage at the voltage rail based on the switching signal; and generate, using the ADC, a set of measured voltage values based on the voltage at the voltage rail during the measurement time.

Example 19: The system of example 18, further comprising a gate driver configured to generate the driving signal to drive a switching element to refrain from electrically coupling the phase to the reference rail when the switching signal indicates to electrically couple the phase to the voltage rail and to electrically couple the phase to the reference rail when the switching signal indicates to electrically couple the phase to the reference rail.

Example 20: The system of example 19, wherein the gate driver comprises a low-side gate driver.

Various aspects have been described in this disclosure. These and other aspects are within the scope of the following claims.

The invention claimed is:

1. A device configured to monitor a voltage at a voltage rail for driving a motor, the device comprising processing circuitry configured to:
 receive an indication of a switching signal for a phase of a plurality of phases of the motor, wherein inverter circuitry associated with the device is configured to electrically couple the phase to the voltage rail or to a reference rail associated with the voltage rail based on a driving signal that is generated based on the switching signal;
 determine a measurement time to measure the voltage at the voltage rail based on the switching signal; and
 generate, using an analog-to-digital converter (ADC), a set of measured voltage values based on the voltage at the voltage rail during the measurement time.

2. The device of claim 1, wherein the device comprises a gate driver configured to generate the driving signal to drive a switching element to refrain from electrically coupling the phase to the reference rail when the switching signal indicates to electrically couple the phase to the voltage rail and to electrically couple the phase to the reference rail when the switching signal indicates to electrically couple the phase to the reference rail.

3. The device of claim 1, wherein, to generate the measurement time, the processing circuitry is configured to determine a first time value of a cycle of the switching signal corresponding to when the switching signal changes from an indication to electrically couple the phase to the voltage rail to an indication to electrically couple the phase to the reference rail.

4. The device of claim 3, wherein, to generate the measurement time, the processing circuitry is configured to generate the measurement time to start after the first time value plus a turn-on delay.

5. The device of claim 4, wherein, to generate the measurement time, the processing circuitry is configured to:
 determine a second time value of the cycle of the switching signal corresponding to when the switching signal changes from the indication to electrically couple the phase to the reference rail to the indication to electrically couple the phase to the voltage rail; and
 generate the measurement time to end when the switching signal changes from the indication to electrically couple the phase to the reference rail to the indication to electrically couple the phase to the voltage rail.

6. The device of claim 3, wherein, to generate the measurement time, the processing circuitry is configured to generate the measurement time to start after the first time value plus a programmable delay.

7. The device of claim 6, wherein the programmable delay is defined to start the measurement time when all of the phases of the motor are coupled to the reference node.

8. The device of claim 6, wherein the programable delay is a first programable delay and wherein, to generate the measurement time, the processing circuitry is configured to generate the measurement time to end after a second programmable delay.

9. The device of claim 8, wherein the second programmable delay is defined to end the measurement time when one or more of the phases of the motor are coupled to the voltage rail.

10. The device of claim 1, wherein the switching signal is a first switching signal, the phase is a first phase, the measurement time is a first measurement time and the set of measured voltage values is a first set of measured voltage values, and wherein the processing circuitry is further configured to:
 determine a second measurement time to measure the voltage at the voltage rail based on a second switching signal, wherein the inverter circuitry is further configured to electrically couple a second phase of the plurality of phases of the motor to the voltage rail or to the reference rail based on a second driving signal generated using the second switching signal; and
 generate a second set of measured voltage values based on the voltage at the voltage rail during the second measurement time.

11. The device of claim 10, wherein the processing circuitry is configured to generate an averaged voltage value for the voltage rail based on the first set of measured voltage values and the second set of measured voltage values.

12. The device of claim 10, wherein the processing circuitry is configured to:
 generate a first averaged voltage value for the voltage rail based on the first set of measured voltage values; and
 generate a second averaged voltage value based on the second set of measured voltage values.

13. The device of claim 1, wherein the processing circuitry is further configured to output voltage rail voltage information to a host controller, wherein the voltage rail voltage information comprises one or more of the set of measured voltage values or an averaged voltage value generated based on the set of measured voltage values.

14. The device of claim 13, wherein the host controller is configured to generate the switching signal based on the voltage rail voltage information.

15. The device of claim 13, wherein the host controller is further configured to determine whether an unsafe voltage is occurring at the voltage rail based on the voltage rail voltage information.

16. The device of claim 1, wherein the ADC comprises one or more of a successive-approximation ADC or a delta-sigma ADC.

17. A method of monitoring a voltage at a voltage rail for driving a motor, the method comprising:
 receiving, with processing circuitry, an indication of a switching signal for a phase of a plurality of phases of the motor, wherein inverter circuitry associated with the processing circuitry is configured to electrically couple the phase to the voltage rail or to a reference rail associated with the voltage rail based on a driving signal that is generated based on the switching signal;
 determining, with the processing circuitry, a measurement time to measure the voltage at the voltage rail based on the switching signal; and
 generating, with the processing circuitry and using an analog-to-digital converter (ADC), a set of measured voltage values based on the voltage at the voltage rail during the measurement time.

18. A system comprising:
 a host controller configured to generate a switching signal;
 inverter circuitry;
 an analog-to-digital converter (ADC); and
 processing circuitry configured to:
  receive an indication of the switching signal for a phase of a plurality of phases of a motor, wherein the inverter circuitry is configured to electrically couple the phase to a voltage rail or to a reference rail associated with the voltage rail based on a driving signal that is generated based on the switching signal;

determine a measurement time to measure the voltage at the voltage rail based on the switching signal; and generate, using the ADC, a set of measured voltage values based on the voltage at the voltage rail during the measurement time.

19. The system of claim 18, further comprising a gate driver configured to generate the driving signal to drive a switching element to refrain from electrically coupling the phase to the reference rail when the switching signal indicates to electrically couple the phase to the voltage rail and to electrically couple the phase to the reference rail when the switching signal indicates to electrically couple the phase to the reference rail.

20. The system of claim 19, wherein the gate driver comprises a low-side gate driver.

\* \* \* \* \*